(12) United States Patent
Dietrich et al.

(10) Patent No.: US 6,437,410 B1
(45) Date of Patent: Aug. 20, 2002

(54) INTEGRATED MEMORY

(75) Inventors: Stefan Dietrich, Türkenfeld; Musa Saglam; Peter Schrögmeier, both of Munich; Michael Markert, Augsburg; Sabine Schöniger; Christian Weis, both of Munich, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/603,749

(22) Filed: Jun. 26, 2000

(30) Foreign Application Priority Data

Jun. 25, 1999 (DE) .......................... 199 29 172

(51) Int. Cl.⁷ .................. H01L 29/76; H01L 29/94; H01L 31/062; H01L 31/113; H01L 31/119
(52) U.S. Cl. .................. 257/390; 257/208; 365/72; 365/191; 365/230.02; 365/230.03; 365/230.04; 365/230.05; 365/230.06
(58) Field of Search .................. 257/208, 390; 365/72, 189.05, 189.08, 191, 220, 230.02, 230.04, 230.05, 230.06

(56) References Cited

U.S. PATENT DOCUMENTS 6,266,293 B1 * 7/2001 Miike .................. 365/230.08
6,330,186 B2 * 11/2001 Tanaka .................. 365/185.11
6,356,491 B1 * 3/2002 Mullarky et al. .......... 365/201

FOREIGN PATENT DOCUMENTS

DE 195 38 994 C2 4/1998

* cited by examiner

*Primary Examiner*—Ngân V. Ngô
(74) *Attorney, Agent, or Firm*—Laurence A. Greenberg; Werner H. Stemer; Ralph E. Locher

(57) ABSTRACT

The integrated memory has a first address path, via which the address terminals are connected to first selection lines of a first group and which has corresponding first lines and a first decoder circuit. In addition, the integrated memory has a second address path, via which the address terminals are connected to first selection lines of a second group and which has corresponding second lines and a second decoder circuit. The first decoder circuit is faster than the second decoder circuit. The first lines have a longer signal propagation time than the second lines.

5 Claims, 3 Drawing Sheets

INTEGRATED MEMORY

BACKGROUND OF THE INVENTION

FIELD OF THE INVENTION

The invention lies in the integrated technology field. More specifically, the invention relates to an integrated memory having memory cells, which can be selected via first selection lines and second selection lines, whose first selection lines are subdivided into a first group and into a second group and which has address terminals for feeding in addresses, via which the first selection lines of the two groups can be addressed. The integrated memory has a first address path, via which the address terminals are connected to the first selection lines of the first group and which has corresponding first lines and a first decoder circuit. In addition, the integrated memory has a second address path, via which the address terminals are connected to the first selection lines of the second group and which has corresponding second lines and a second decoder circuit. In this case, the first decoder circuit performs decoding of addresses that are fed to it more rapidly than the second decoder circuit of the integrated memory.

One type of such integrated memories are the so-called Double Data Rate DRAMs (DDR—Dynamic Random Access Memories), in which the first selection lines are column select lines and the second selection lines are word lines. With each rising clock signal edge, a column address is transferred to the memory at its address terminals. Within the memory, a column select line is then activated with the applied column address and a column select line is activated with a column address which follows the applied column address. Two data words are processed simultaneously in each clock cycle. One of the data words has the respective column address that is present and the other data word has a column address which follows the former column address and is calculated therefrom. The second address is generated from the respective column address that is present by the second decoder circuit. Thus, in contrast to the first decoder circuit, the second decoder circuit does not carry out simple decoding of the applied column addresses but additionally address transformation by means of which the second column address derived from the address that is present is generated. Therefore, the second decoder circuit, via which the column select lines of the second group are addressed, has a more complex construction than the first decoder circuit, via which the column select lines of the first group are addressed. For this reason, the decoding by means of the first decoder circuit takes place more rapidly than the decoding by means of the second decoder circuit.

SUMMARY OF THE INVENTION

The invention is based on the object of specifying an integrated memory of the type described in which, despite the different decoding times of the first and second decoder circuits, when a column address is present at the address terminals, it is possible to obtain an activation time of approximately the same length for the first selection lines of the first and second groups.

With the foregoing and other objects in view there is provided, in accordance with the invention, an integrated memory, comprising:

a plurality of memory cells, first selection lines and second selection lines connected to the memory cells;

the first selection lines being divided into a first group and into a second group;

address terminals for feeding in addresses for addressing the first selection lines of the first and second groups;

a first address path connecting the address terminals to the first selection lines of the first group, and having corresponding first lines and a first decoder circuit;

a second address path connecting the address terminals to the first selection lines of the second group, and having corresponding second lines and a second decoder circuit;

the first decoder circuit being configured to decode addresses received therein more rapidly than the second decoder circuit; and the first lines having a longer signal propagation time than the second lines.

In other words, the first lines of the first address path have a longer signal propagation time than the second lines of the second address path. The first address path contains the fast first decoder circuit and the slow first lines. The second address path contains the slow second decoder circuit and the fast second lines. Consequently, the different processing speed by the two decoder circuits is (at least partly) compensated for by the different signal propagation times of the first and second lines.

By way of example, the first selection lines may be column select lines and the second selection lines may be word lines of the memory. The opposite may also be true in other embodiments of the invention.

In accordance with an added feature of the invention, the first lines are longer than the second lines. Here, the different signal propagation times of the first and second lines are obtained by the different line lengths. According to another embodiment of the invention, the different signal propagation times may also be obtained by different conductivities of the lines, for example, with the first lines having a lower conductivity than the second lines.

In accordance with an additional feature of the invention, the second decoder circuit comprises the first decoder circuit and a transformation unit connected between the first decoder circuit and the first selection lines of the second group, the transformation unit generating transformed output signals from output signals of the first decoder circuit. In this embodiment, the second decoder circuit is formed with the first decoder circuit together with a transformation unit connected downstream of the latter. The transformation unit generates transformed output signals from the output signals of the first decoder circuit. This has the advantage that the components of the first decoder circuit do not have to be provided twice in the two address paths. Thus, in the case of the embodiment of the invention that was outlined last, parts of the two address paths correspond to one another.

In accordance with a concomitant feature of the invention, when an address is applied to the address terminals, one of the first selection lines of the first group is selected via the first address path and, at the same time, one of the first selection lines of the second group is selected via the second address path.

The first and the second decoder circuit may be constructed in a single-stage manner or in a multistage manner. They may be arranged in the respective address path either in a centralized manner, or that is to say in a block, or, in a manner subdivided in a plurality of stages, in a decentralized manner, or that is to say in a distributed manner.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

It should be noted that, while the exemplary embodiments of the invention which are described below involve integrated memories of the DDR-DRAM type, the invention can also be applied to other types of memory.

Figure 1:
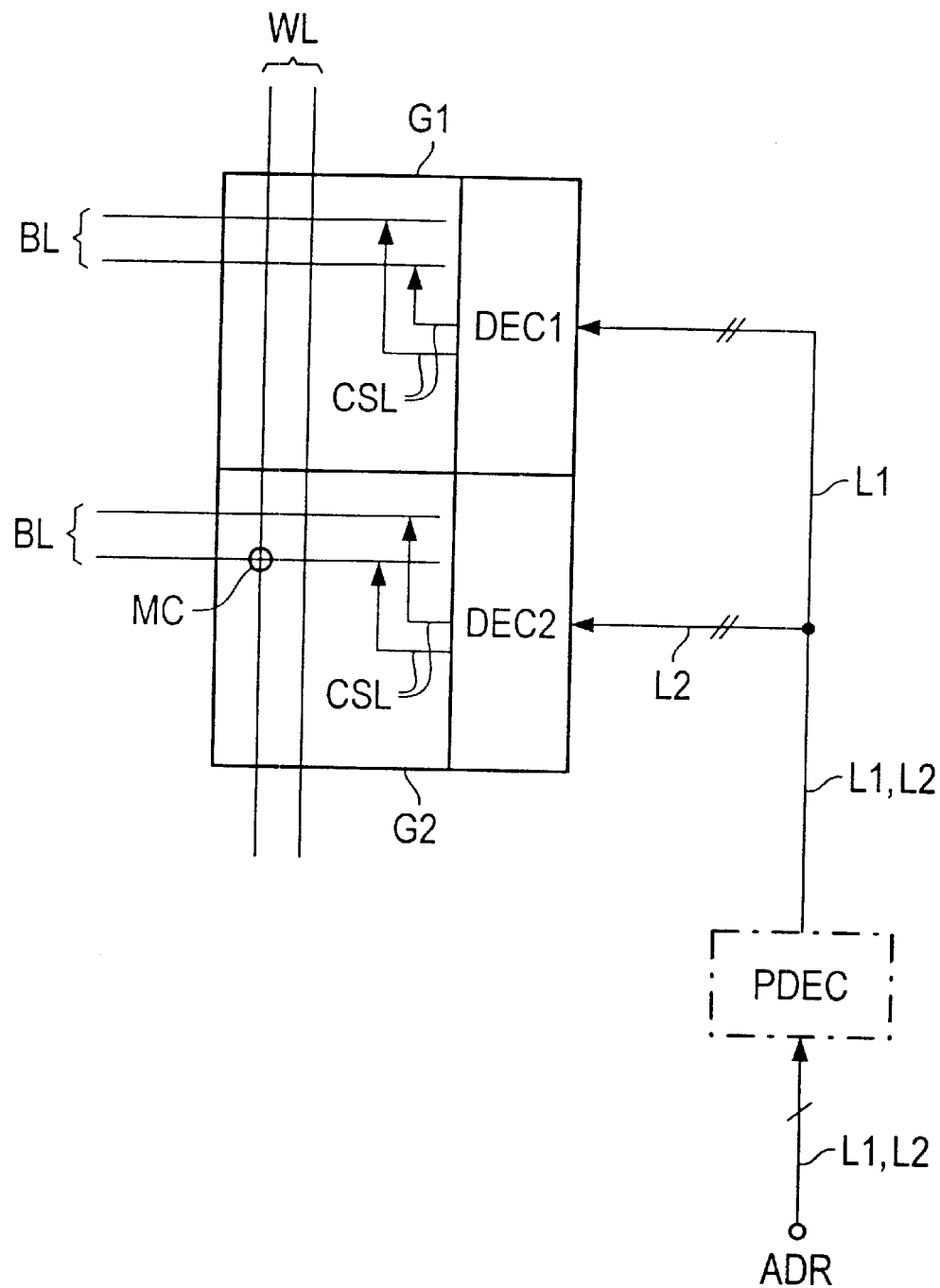
FIG. 1 is a schematic block diagram of a first exemplary embodiment of the integrated memory according to the invention.

Referring now to the figures of the drawing in detail and first, particularly, to FIG. 1 thereof, there is shown a first exemplary embodiment of the memory according to the invention. Memory cells MC are arranged at crossover points between word lines WL and bit lines BL. The word lines WL can be selected via non-illustrated row decoders and row addresses which are fed to the row decoders. The bit lines BL can be selected via column select lines CSL. The column select lines CSL which are assigned to the bit lines BL in the upper part of FIG. 1 are combined to form a first group G1. The column select lines CSL which are assigned to the bit lines BL in the lower part of FIG. 1 are combined to form a second group G2. The column select lines CSL of the first group G1 are connected to the outputs of a first decoder circuit DEC1 and those of the second group G2 are connected to the outputs of a second decoder circuit DEC2.

The memory furthermore has address terminals ADR for applying column addresses, which are connected via a first address path to the column select lines CSL of the first group G1 and via a second address path to the column select lines CSL of the second group G2. A predecoder PDEC is depicted in a dashdotted box in FIG. 1. The predecoder may be connected upstream of the decoder circuits DEC1, DEC2 but is not necessary for understanding the invention. For this reason, the predecoder PDEC is not discussed any further below.

While the first decoder circuit DEC1 performs simple decoding of the column addresses that are fed to it via the first lines L1, the second decoder circuit DEC2 has a more complex construction since it serves to generate a column address which is derived from the column address respectively present at the address terminals ADR. On account of its more complex construction, the second decoder circuit DEC2 is slower than the first decoder circuit DEC1. This means that column addresses present at its inputs lead to the activation of one of its outputs only after a longer period of time than is the case with the first decoder circuit DEC1.

The first address path, which is arranged between the address terminals ADR and the column select lines CSL of the first group G1, has first lines L1 and the first decoder circuit DEC1. The second address path, which is arranged between the address terminals ADR and the column select lines CSL of the second group G2, has second lines L2 and the second decoder circuit DEC2. Parts of the first lines L1 and second lines L2 are identical to one another.

The first decoder circuit DEC1 and the second decoder circuit DEC2 in FIG. 1 are arranged in such a way that they are at different distances from the address terminals ADR. Therefore, the total length of the first lines L1 is greater than that of the second lines L2. This results in a longer signal propagation time for the first lines L1 than for the second lines L2. The difference between the signal propagation times via the first and second lines is chosen such that the different decoding times of the first decoder circuit DEC1 and of the second decoder circuit DEC2 are compensated for. The result of this is that column addresses present at the address terminals ADR lead, via the first address path, virtually just as rapidly to the selection of one of the column select lines CSL of the first group G1 as, via the second address path, to the selection of one of the column select lines CSL of the second group G2. Consequently, data from both groups G1, G2 are present practically simultaneously at outputs of the memory.

In other embodiments of the invention, it is possible for the different propagation time of the first lines L1 and of the second lines L2 also to be effected by a different conductivity of the lines, as an alternative or in addition to the different lengths of the lines. In that case, the different conductivities of the first and second lines L1, L2 can be realized either by different line cross-sections or by using different materials.

Figure 2:
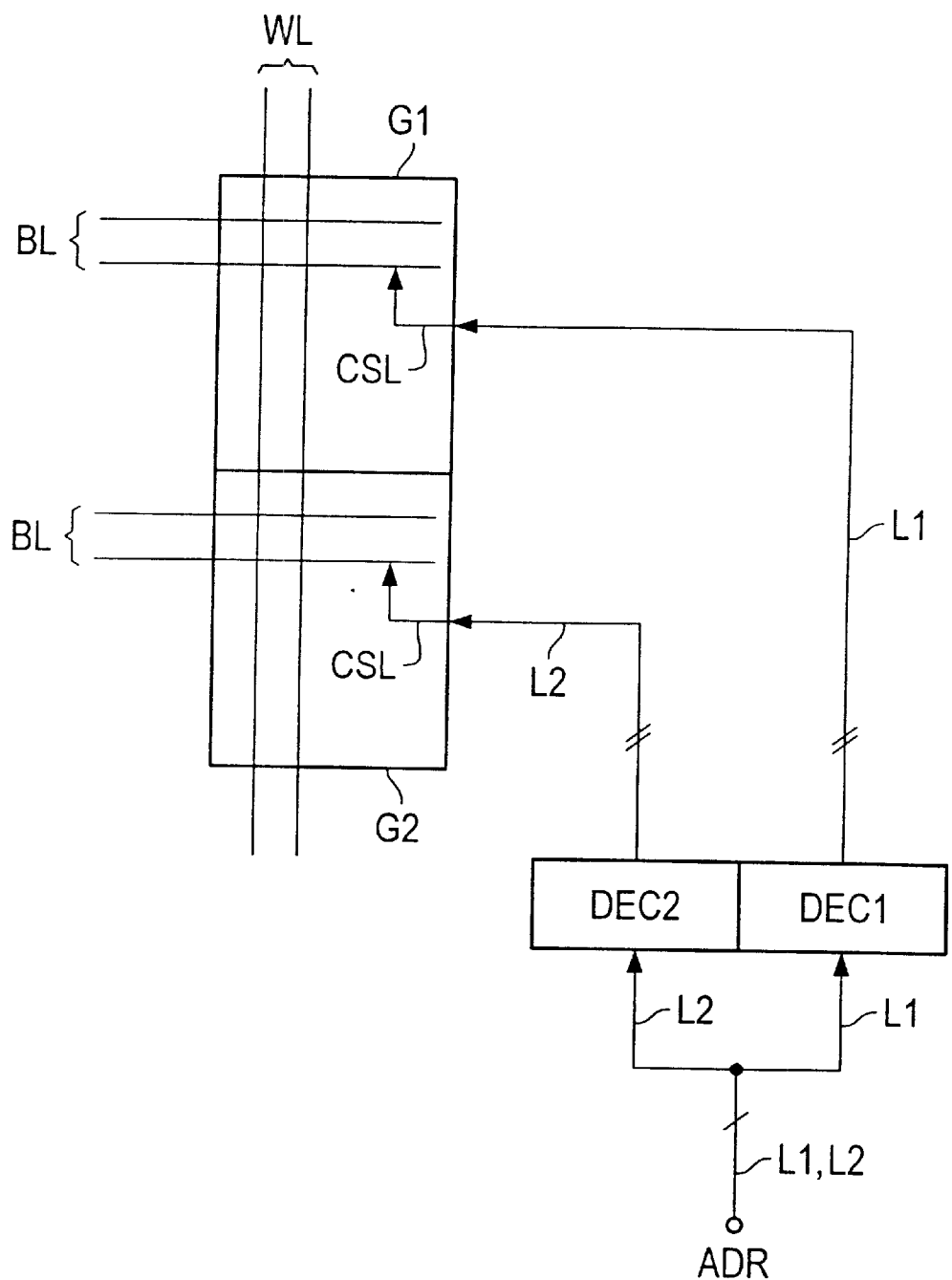
FIG. 2 is a similar view of a second exemplary embodiment of the memory.

Referring now to FIG. 2, there is shown a second exemplary embodiment of the integrated memory according to the invention, in which, in a departure from FIG. 1, on the output side the first decoder circuit DEC1 and the second decoder circuit DEC2 are not connected directly to the column select lines CSL but rather via the first lines L1 and second lines L2, respectively. In the case of this exemplary embodiment and the exemplary embodiment which will be explained later with reference to FIG. 3, the column select lines CSL practically form part of the first lines L1 and second lines L2, respectively. By way of example, driver circuits may also be provided between the lines L1, L2 and the column select lines CSL.

In the case of the exemplary embodiment as shown in FIG. 2 as well, the line length of the first lines L1 differs from that of the second lines L2, thereby causing longer signal propagation times of the first lines L1. The slower decoding time of the second decoder circuit DEC2 compared with the first decoder circuit DEC1 is once again compensated for by this means, so that when a column address is applied to the address terminals ADR, in each case one of the column select lines CSL of each group G1, G2 is activated virtually simultaneously.

In other exemplary embodiments of the invention, it is also possible for the different propagation time of the signals on the first lines L1 and second lines L2 to only partly compensate for the different decoding times of the decoder circuits DEC1 and DEC2. In the case of these embodiments of the invention, the activation times for the column select lines CSL of the two groups G1, G2 are brought into line to a slighter extent.

Figure 3:
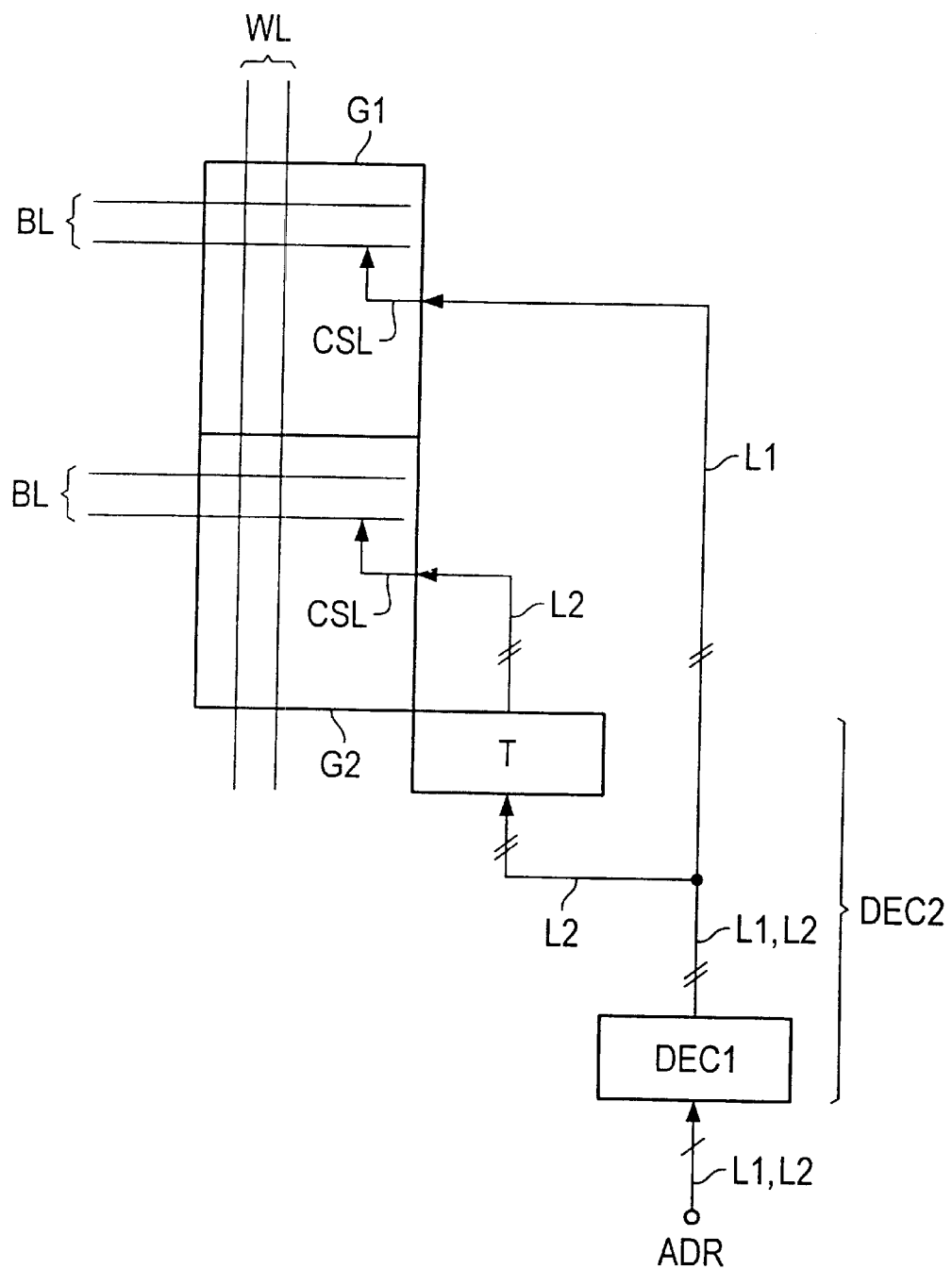
FIG. 3 is a similar view of a third exemplary embodiment of the memory.

Referring now to FIG. 3, there is shown a further exemplary embodiment of the integrated memory, in which the two address paths which serve for the selection of the column select lines CSL of the different groups G1, G2 branch only downstream of the outputs of the first decoder circuit DEC1. While the outputs of the first decoder circuit DEC1 are connected via the first lines L1 directly to a respective one of the column select lines CSL of the first group G1, they are connected via the second lines L2 via a transformation unit T to the column select lines CSL of the second group G2. In this exemplary embodiment, the second decoder circuit DEC2 comprises the first decoder circuit DEC1 and also the transformation unit T. While the first decoder circuit DEC1 performs the same decoding of the column addresses that are fed to it for both address paths, the transformation unit T in the second address path serves for converting or transforming the column address decoded by the first decoder circuit DEC1. By virtue of the presence of the transformation unit T, the second decoder circuit DEC2 is slower than the first decoder circuit DEC1 in this exemplary embodiment, too. The transformation unit T has the effect that, via one of its outputs in each case, a different column select line CSL of the second group G2 is activated than if these were connected directly to the outputs of the first decoder circuit DEC1.

In all of the exemplary embodiments outlined above, it is the case, as is customary in the case of DDR-DRAMs, that in both groups G1, G2, via the same column address fed in via the address terminals ADR, in both groups G1, G2, in each case one of the column select lines CSL is activated, which are arranged at different positions within the respective group G1, G2. In all cases, the longer decoding time of the second decoder circuit DEC2 is to be attributed to the fact that the latter, in contrast to the first decoder circuit DEC1, does not carry out simple decoding of the column addresses that are fed to it, but simultaneously carries out address transformation by means of which a derived column address is generated from the column address that is fed in.

In the exemplary embodiments outlined, the memory cells MC are arranged within a memory cell array which comprises the two groups G1, G2. The cell array takes up a relatively small area on the chip. Since the column addresses are fed in from that side of the cell array at which the second group G2 is arranged, the length of the first lines L1 differs considerably from that of the second lines L2. Consequently, there result considerable propagation time differences on the different lines, which compensate for a considerable part of the different decoding times of the two decoder circuits.

We claim:

1. An integrated memory, comprising:
   a plurality of memory cells, first selection lines and second selection lines connected to said memory cells;
   said first selection lines being divided into a first group and into a second group;
   address terminals for feeding in addresses for addressing said first selection lines of said first and second groups;
   a first address path connecting said address terminals to said first selection lines of said first group, and having corresponding first lines and a first decoder circuit;
   a second address path connecting said address terminals to said first selection lines of said second group, and having corresponding second lines and a second decoder circuit;
   said first decoder circuit being configured to decode addresses received therein more rapidly than said second decoder circuit; and
   said first lines having a longer signal propagation time than said second lines.

2. The integrated memory according to claim 1, wherein said first lines are longer than said second lines.

3. The integrated memory according to claim 1, wherein said first lines have a lower conductivity than said second lines.

4. The integrated memory according to claim 1, wherein said second decoder circuit comprises said first decoder circuit and a transformation unit connected between said first decoder circuit and said first selection lines of said second group, said transformation unit generating transformed output signals from output signals of said first decoder circuit.

5. The integrated memory according to claim 1, wherein, when an address is applied to said address terminals, one of said first selection lines of said first group is selected via said first address path and, at the same time, one of said first selection lines of said second group is selected via said second address path.

* * * * *